US008111094B2

(12) United States Patent
Fischer

(10) Patent No.: US 8,111,094 B2
(45) Date of Patent: Feb. 7, 2012

(54) ANALOG MULTIPLEXER CIRCUITS AND METHODS

(75) Inventor: Jonathan H. Fischer, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/829,129

(22) Filed: Jul. 1, 2010

(65) Prior Publication Data

US 2011/0002062 A1 Jan. 6, 2011

Related U.S. Application Data

(63) Continuation-in-part of application No. 10/719,645, filed on Nov. 21, 2003, now Pat. No. 7,773,332.

(51) Int. Cl.
*H03K 17/00* (2006.01)
(52) U.S. Cl. .............................. 327/407; 327/408
(58) Field of Classification Search .................. None
See application file for complete search history.

(56) References Cited

U.S. PATENT DOCUMENTS

| | | | |
|---|---|---|---|
| 4,352,070 A | 9/1982 | Beauducel et al. | |
| 4,370,572 A | 1/1983 | Cosand et al. | |
| 5,032,739 A * | 7/1991 | Koh ............................... | 327/403 |
| 5,036,219 A | 7/1991 | Dingwall et al. | |
| 5,172,117 A | 12/1992 | Mills et al. | |
| 5,313,113 A | 5/1994 | Linder | |
| 5,331,478 A | 7/1994 | Aranovsky | |
| 5,334,881 A * | 8/1994 | Kirkpatrick ................... | 327/407 |
| 5,341,037 A | 8/1994 | Miki et al. | |
| 5,422,583 A | 6/1995 | Blake et al. | |
| 5,572,154 A | 11/1996 | Rakers et al. | |
| 5,612,698 A | 3/1997 | Reay | |
| 5,808,502 A * | 9/1998 | Hui et al. ...................... | 327/333 |
| 5,825,571 A | 10/1998 | Sandusky et al. | |
| 5,838,175 A | 11/1998 | Hsieh | |

(Continued)

FOREIGN PATENT DOCUMENTS

JP 55-92028 * 7/1980

(Continued)

OTHER PUBLICATIONS

Takao, A., "Sample Holding Circuit," JP 57 060593 Patent Abstract of Japan vol. 6, No. 137 (Apr. 12, 1982).

(Continued)

*Primary Examiner* — Tuan T Lam
(74) *Attorney, Agent, or Firm* — Ryan, Mason & Lewis, LLP

(57) ABSTRACT

A sample and hold circuit is disclosed that provides longer hold times. An analog multiplexer circuit is also disclosed that exhibits low switch leakage. The analog multiplexer circuit comprises a shared node, a plurality of input circuits, a control input for selecting one or more of the plurality of input circuits, and an amplifier coupled to the shared node. Each input circuit comprises an input node, a primary input switch for selectively coupling an input to the input node, and a secondary input switch for selectively coupling the input node to the shared node, wherein the secondary input switch comprises one or more transistor switches. The parasitic drain and source diodes of one or more transistor switches in secondary input switch in a selected input circuit are coupled to a voltage that is distinct from an input signal of the selected input circuit. For input circuits not selected, the parasitic drain and source diodes of secondary input switch transistor switches are coupled to an output of the amplifier.

13 Claims, 7 Drawing Sheets

U.S. PATENT DOCUMENTS

| | | | |
|---|---|---|---|
| 6,028,459 | A | 2/2000 | Birdsall et al. |
| 6,054,887 | A | 4/2000 | Horie et al. |
| 6,069,502 | A | 5/2000 | Preslar et al. |
| 6,111,467 | A | 8/2000 | Luo |
| 6,262,677 | B1 | 7/2001 | Kiriaki et al. |
| 6,323,696 | B1 | 11/2001 | Hickling et al. |
| 6,335,653 | B1 | 1/2002 | Shigehara et al. |
| 6,522,491 | B1 | 2/2003 | Kawai |
| 6,570,516 | B1 | 5/2003 | Barker |
| 6,721,117 | B2 | 4/2004 | Briskin |
| 6,909,249 | B2 | 6/2005 | Otake |
| 7,034,607 | B2 | 4/2006 | Otake |
| 7,208,993 | B2 * | 4/2007 | Torres et al. .................. 327/403 |
| 2001/0026175 | A1 | 10/2001 | Ueno |
| 2008/0074166 | A1 * | 3/2008 | Merandat et al. ............. 327/407 |
| 2008/0272825 | A1 * | 11/2008 | Miyada ......................... 327/408 |
| 2009/0085646 | A1 * | 4/2009 | Ha et al. ........................ 327/408 |

FOREIGN PATENT DOCUMENTS

| | | |
|---|---|---|
| JP | 7220207 A | 8/1995 |

OTHER PUBLICATIONS

Mitsuharu, T., "Sample/Holding Circuit," JP 61 099998 Patent Abstract of Japan, vol. 10, No. 278 (May 19, 1986).

Horowitz et al., "The Art of Electronics," Second Edition, Cambridge University Press, pp. 217-219 (1989).

* cited by examiner

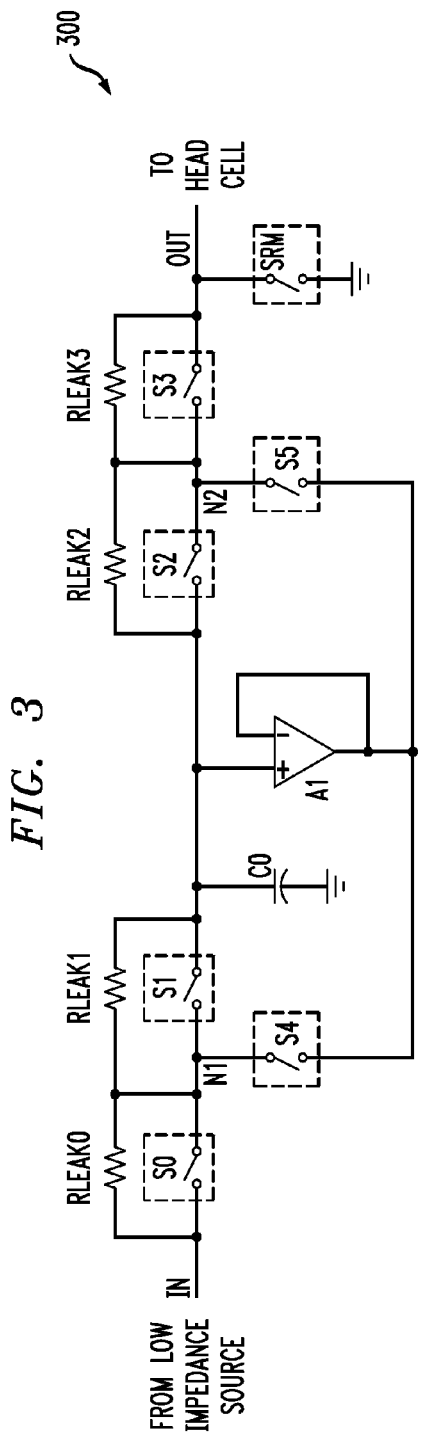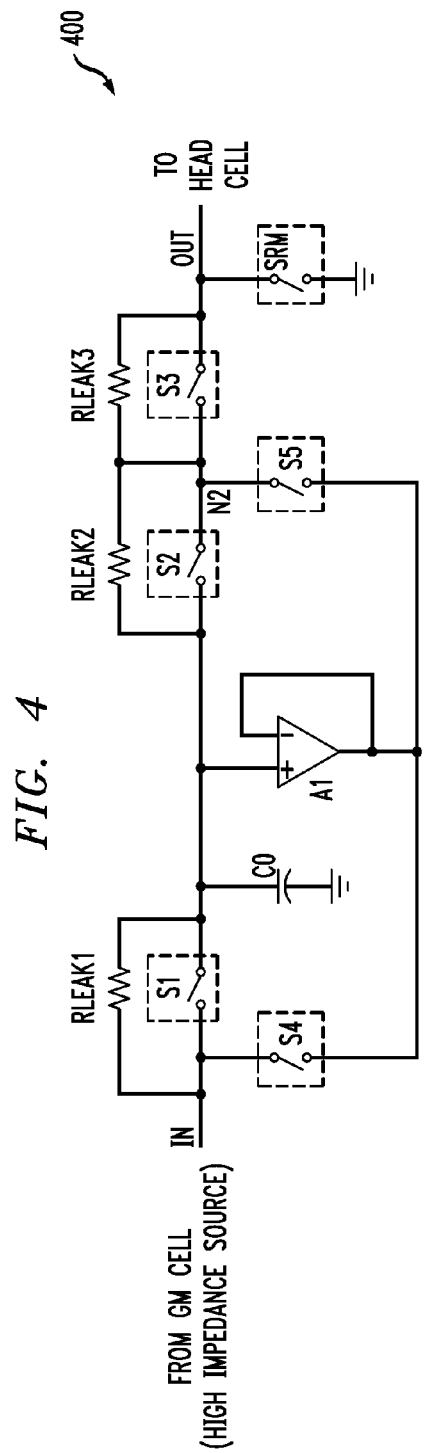

700

US 8,111,094 B2

ANALOG MULTIPLEXER CIRCUITS AND METHODS

CROSS-REFERENCE TO RELATED APPLICATION(S)

This application is a continuation-in-part of U.S. patent application Ser. No. 10/719,645, filed Nov. 21, 2003, which is incorporated herein by reference.

FIELD OF THE INVENTION

The present invention relates generally to circuits, and more particularly, to sample and hold circuits that provide longer hold times and multiplexer circuits that exhibit low leakage switching.

BACKGROUND OF THE INVENTION

Disc drives typically use magneto-resistive read heads to support high data densities. These magneto-resistive heads require a DC bias to operate (typically provided by a preamplifier). In a mobile application, however, power consumption is an important issue. Thus, a number of techniques have been proposed or suggested to reduce the power consumption of disc drives for mobile applications. Biasing of magneto resistive heads is also varied over time to extend the lifetime of the sensor. For example, sample and hold circuits have been proposed to allow the bias control circuits of the read head to be powered down when writing data to the disc while maintaining short write-to-read transition times.

In one proposed implementation of a sample and hold circuit, the disc drive power consumption was effectively reduced, but the maximum hold time was only on the order of 30 microseconds, due to switch leakage paths. For a number of applications, however, a longer hold time may be necessary.

Data acquisition systems typically monitor and quantize analog signals to allow digital techniques to be used for signal analysis and data storage. To minimize costs, a multiplexer is usually placed between the signal sources and an analog-to-digital converter (ADC). For precision data measurement, it is important to minimize the effects caused by the input signals associated with the unselected inputs being coupled into the selected signal path. Current methods of implementing the multiplexer in CMOS technology suffer from finite switch leakage resistance and from parasitic diode leakage from the MOS device into its isolation diffusions.

A need therefore exists for a disc drive having a sample and hold technique with a longer hold time. A further need exists for a disc drive employing a sample and hold technique that provides improved read-to-write and write-to-read mode transitions. A need also exists for circuits and techniques to minimize the effects of switch leakage resistance and leakage through the drain and source junction diodes into the isolation diffusions of switches in an analog multiplexer.

SUMMARY OF THE INVENTION

Generally, a sample and hold circuit is disclosed that provides longer hold times. The disclosed sample and hold circuit can be used in a disc drive to provide improved write-to-read mode transitions. The sample and hold circuit has an input and an output, and includes at least one capacitive element for retaining a charge. The capacitive element is connected to a node between the input and the output. The sample and hold circuit includes at least one input switch to selectively connect the capacitive element to the input and at least one output switch to selectively connect the capacitive element to the output. In addition, an amplifier is connected to multiple nodes and has an offset voltage. In this manner, a voltage drop across at least one of the input and output switches is limited to the offset voltage.

From a process point of view, a method is provided for reducing leakage in a sample and hold circuit having at least one capacitive element for retaining a charge. The method comprises the steps of (i) configuring at least one input switch to selectively connect the at least one capacitive element to the input; (ii) configuring at least one output switch to selectively connect the at least one capacitive element to the output; and (iii) limiting a voltage drop across at least one of the input and output switches to an offset voltage of an amplifier connected to the input or output node.

The disclosed sample and hold circuit can be used, for example, in a preamplifier for a head bias circuit in a storage system. In a further variation, the sample and hold circuit includes at least two switches that selectively connect at least one of the input and output switches to an output of the amplifier in a hold mode or to standard voltages in read mode, in order to reduce leakage effects due to parasitic diodes in the input and output switches.

Generally, an analog multiplexer circuit is disclosed that exhibits low switch leakage. The analog multiplexer circuit comprises a shared node, a plurality of input circuits, a control input for selecting one or more of the plurality of input circuits, and an amplifier coupled to the shared node. Each input circuit comprises an input node, a primary input switch for selectively coupling an input to the input node, and a secondary input switch for selectively coupling the input node to the shared node, wherein the secondary input switch comprises one or more transistor switches. The parasitic drain and source diodes of one or more transistor switches in a secondary input switch in a selected input circuit are coupled to a voltage that is distinct from an input signal of the selected input circuit. For input circuits not selected, the parasitic drain and source diodes of secondary input switch transistor switches are coupled to an output of the amplifier.

A more complete understanding of the present invention, as well as further features and advantages of the present invention, will be obtained by reference to the following detailed description and drawings.

BRIEF DESCRIPTION OF THE DRAWINGS

FIG. 3 illustrates a sample and hold circuit having low leakage in accordance with the present invention;

FIG. 4 illustrates an alternate sample and hold circuit having low leakage in accordance with the present invention;

DETAILED DESCRIPTION

Figure 1:
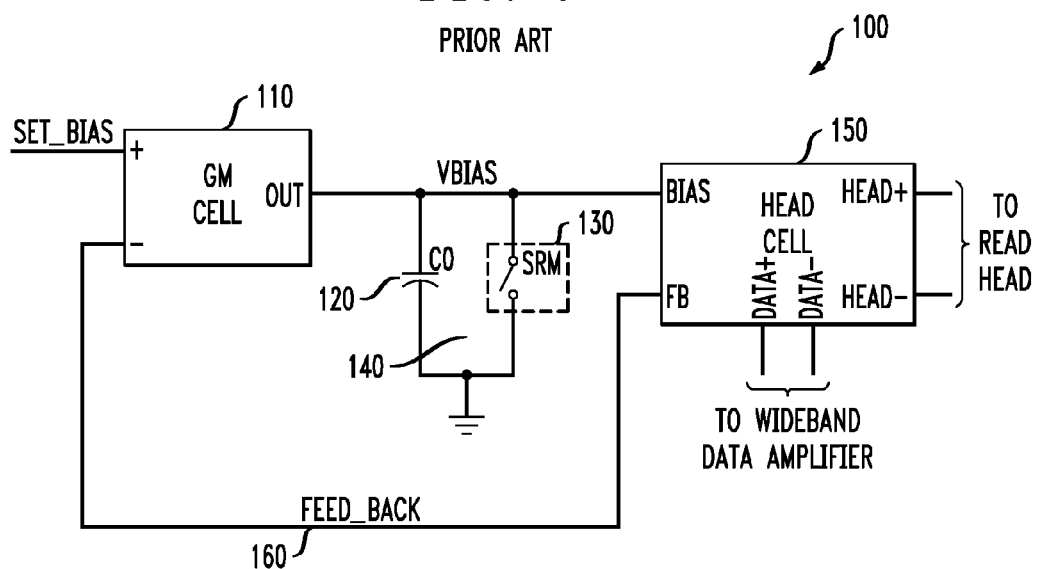
FIG. 1 is a schematic block diagram of a conventional preamplifier head bias circuit.

FIG. 1 is a schematic block diagram of a conventional preamplifier head bias circuit 100. A person of ordinary skill in the art would recognize that other circuits and devices may be interposed between circuits and devices illustrated in the figures. The preamplifier head bias circuit 100 may be used, for example, in a disk drive to bias a magneto-resistive sensor for reading. As shown in FIG. 1, the preamplifier head bias circuit 100 includes a transconductance (GM) cell 110, a bias capacitor 120 in parallel with a short read head bias (SRM) switch 130, and a head cell 150. The output of the head cell 150 is provided to the read head (not shown). Thus, the positive and negative outputs of the head cell 150 carry both the DC bias and data signal. Generally, the transconductance cell 110 takes an input voltage and generates an output current, in a known manner. In a read mode, a feedback loop 160 is connected to the negative input of the transconductance cell 110 to force the head DC voltage to the SET_BIAS level that is set at the positive input of the transconductance cell 110. The bandwidth of the bias loop 140 is set lower than the data spectrum to prevent data waveform distortion. To maximize read head life and minimize power dissipation, the head bias is turned off by switch SRM 130 when not reading data from the disc. The internal bias level (VBIAS) must be restored at the start of the next read period.

To meet the write-to-read specification (such as less than 125 ns for exemplary mobile drives), a high power, wide bandwidth feedback loop 160 is needed if VBIAS must be re-acquired at the start of each read period (the loop bandwidth is then reduced for the remainder of the read period). The loop power dissipation and complexity can be significantly reduced if the value of VBIAS is stored during write mode so the head can be quickly be set to the proper bias level at the start of the next read period.

Digital or analog methods can store VBIAS. The digital approach (storage register or up/down counter, digital-to-analog conversion (DAC), and comparator) offers unlimited hold time. The analog approach employs a sample and hold circuit that takes less area and power. With the analog approach, however, care must be taken to provide a hold time on the order of 200 microseconds time while in write mode without excessive VBIAS drift. The present invention extends the analog sample and hold time, for example, to a value on the order of 200 microseconds, while meeting tight area and power constraints.

Figure 2:
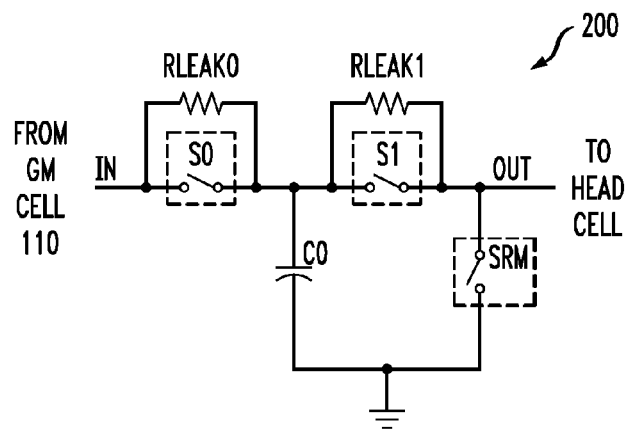
FIG. 2 is a schematic block diagram of a conventional sample and hold circuit that may be used in the preamplifier of FIG. 1.

FIG. 2 shows a conventional sample and hold circuit 200 to retain the steady state read mode VBIAS voltage while in the write mode. The sample and hold circuit 200 is typically built using metal oxide semiconductor (MOS) switches. As shown in FIG. 2, capacitor C0 filters the electrical noise generated in the GM cell 110 and switch S0. Switch S1 must have low resistance when closed so it will not add excessive noise to the bias voltage sent to the head cell. Switch S1 is typically built using short channel MOS devices, which have significant leakages when powered down (open). As shown in FIG. 2, the leakage in an off state, represented by resistors RLEAK0 and RLEAK1, causes the voltage held on capacitor C0 to change (droop) when switches S0 and S1 are open. The droop rate limits the length of time the capacitor voltage stays within a given error band.

While the preamplifier head bias circuit 100 is in a write mode, switch SRM 130 keeps the head cell bias input at ground. At the start of the read mode, switch SRM 130 opens and switches S0 and S1 close. Some of the charge on the capacitor C0 redistributes to the head cell bias line capacitance when switch S1 closes. The loop must now restore the voltage across capacitor C0 to the steady state level.

Thus, the sample and hold circuit 200 of FIG. 2 does not provide a sufficient hold time due to the leakage paths represented by RLEAK0 and RLEAK1. According to one aspect of the present invention, the preamplifier head bias circuit 100 of FIG. 1 is modified to drive sample and hold nodes to reduce the hold switch leakage currents and thereby provide a hold time on the order of 200 microseconds. Thus, a disc drive incorporating the modified preamplifier head bias circuit can maintain a write mode for up to 200 microseconds. In this manner, the preamplifier head bias circuit in accordance with the present invention simultaneously provides (i) lower power dissipation, (ii) faster write-to-read mode transitions and (iii) longer hold modes (on the order of 200 microseconds).

FIG. 3 illustrates a sample and hold circuit 300 having low leakage in accordance with the present invention. The sample and hold circuit 300 reduces the effects of switch off leakage and head cell bias line capacitance. As shown in FIG. 3, the sample and hold switches S0 and S1 from FIG. 2 have each been replaced by two switches in series, S0 and S1, and S2 and S3, respectively. In a read mode, switches S0, S1, S1 and S3 are closed and switches SRM, S4, and S5 are open. The feedback loop charges capacitor C0 to the intended voltage.

In a write mode, switches S0 through S3 are open and switches S4, S5, and SRM are closed. In accordance with the present invention, an amplifier A1 drives nodes N1 and N2 to track the voltage of capacitor C0. In this manner, the voltage across RLEAK1 and RLEAK2 is reduced to the offset voltage of amplifier A1 (on the order of milli-Volts instead of Volts). Thus, when switches S1 and S2 are opened, there is only a small voltage drop across the resistors RLEAK 1 and RLEAK 2, and very little current through the resistors (thereby significantly reducing the leakage). Amplifier A1 may be embodied, for example, as a MOS amplifier so that the small input current of amplifier A1 has little effect on the circuit operation. The new topology allows minimum channel length switches to minimize noise added to the head bias signal without excessive signal droop when holding the bias level.

Proper switch sequencing can eliminate the start up charge sharing between capacitor C0 and the head cell capacitance. For example, at the start of a read mode, switch SRM can be opened first before switch S3 is closed. Amplifier A1 then charges the head cell capacitance to equal the voltage on capacitor C0 without capacitor C0 losing charge. Thereafter, switches S4 and S5 are opened and switches S0 through S2 are closed to complete the head bias feedback loop.

FIG. 4 illustrates an alternate sample and hold circuit 400 having low leakage in accordance with the present invention. The sample and hold circuit 400 of FIG. 4 is a simplification for a preamplifier application, where switch S0 has been removed. The sample and hold circuit 400 of FIG. 4 recognizes that the GM cell 110 of FIG. 1 has a high impedance current source output. When in the hold mode, amplifier A1 keeps the output of GM cell 110 close to the closed loop voltage to minimize transients when changing from the hold to closed loop modes. The amplifier A1 controls the leakage through the resistors RLEAK1 and RLEAK2 and supplies current such that there is minimal drift through the resistor RLEAK3.

It is noted that the leakage of the switches in the sample and hold circuits 300, 400 is represented in FIGS. 3 and 4 by resistances RLEAK0 through RLEAK3, which are attributed to leakage effects of the drain to source path of the MOS devices. In addition to such drain to source leakage effects, however, there is also a leakage effect due to parasitic diodes in the MOS switches. In the sample and hold circuits 300, 400 of FIGS. 3 and 4, for example, there is a parasitic diode leakage effect.

Figure 5:
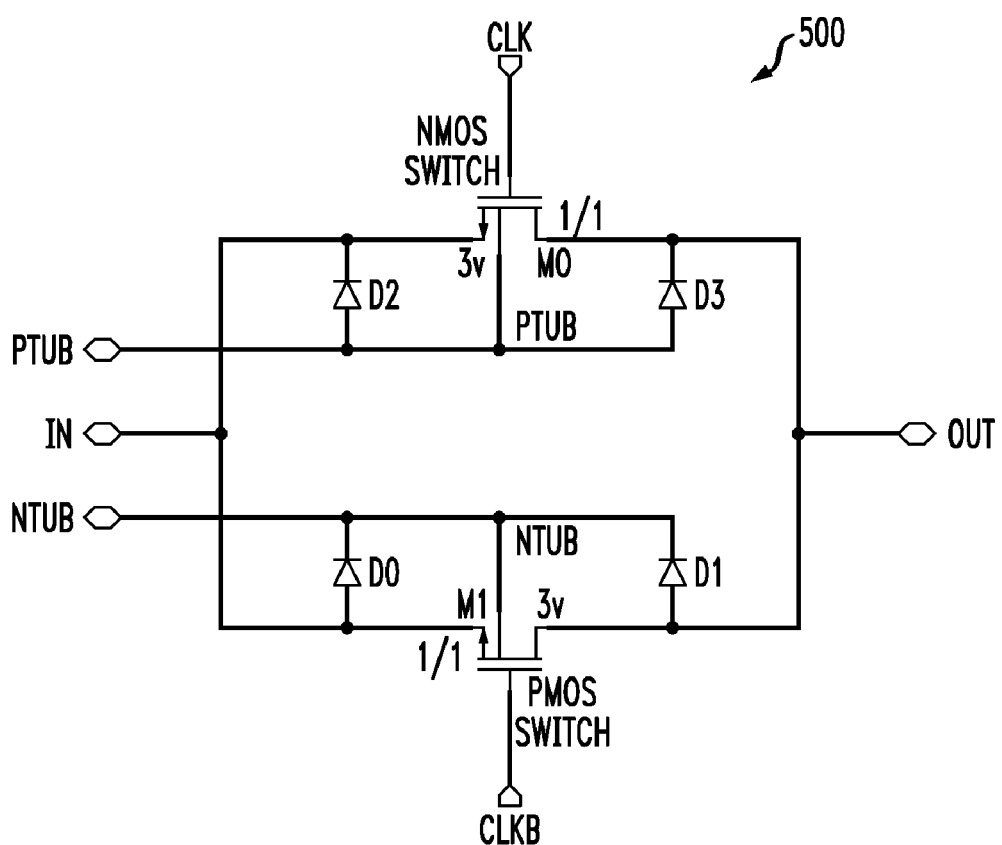
FIG. 5 is a schematic diagram of an exemplary CMOS switch suitable for use in the sample and hold circuits of the present invention.

FIG. 5 is a schematic diagram of an exemplary CMOS switch 500 suitable for use in the sample and hold circuits 300, 400 of the present invention. As shown in FIG. 5, in addition to the switch off resistance, the transistors also have parasitic drain and source diodes, shown as D0-D3. The NTUB is tied to a voltage that is more positive than the input signal (typically tied to VCC, VDD), so the diodes D0 and D1 tend to pull the signals IN and OUT up towards the power supply. The PTUB is tied to a voltage that is more negative than the input signal (typically tied to ground), so the diodes D2 and D3 tend to pull the signals IN and OUT towards ground. The net effect of the diode leakage currents is difficult to predict because of the variation in leakage with temperature and process.

Figure 6:
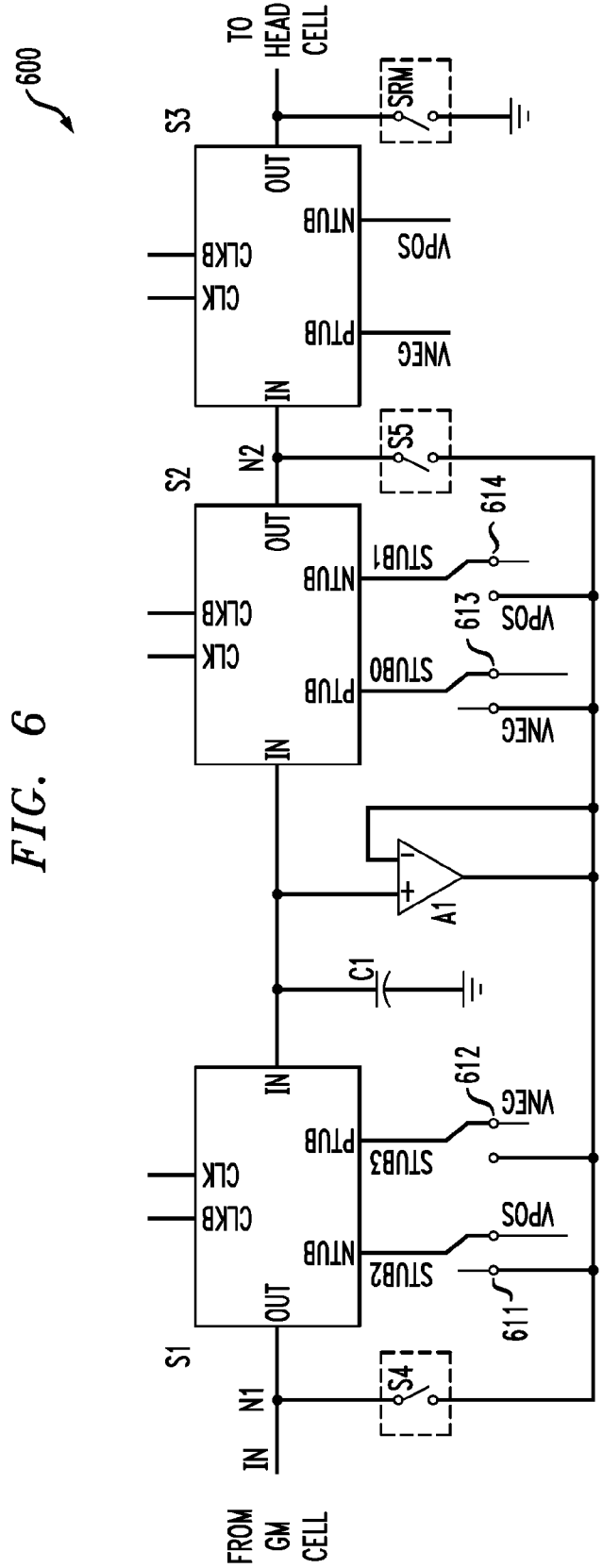
FIG. 6 illustrates an alternate sample and hold circuit having low leakage in accordance with the present invention.

Thus, according to another aspect of the present invention, a sample and hold circuit 600 is provided that reduces the leakage effects of both the drain to source paths and the parasitic diodes in the MOS switches. FIG. 6 illustrates an alternate sample and hold circuit 600 having low leakage in accordance with the present invention. It is noted that NTUB and PTUB, shown in FIG. 5, are generally junction isolated from the substrate in a triple well process used for preamplifiers.

The sample and hold circuit 600 of FIG. 6 recognizes that the isolated tubs can be advantageously used to reduce the diode leakage currents in a hold mode. As shown in FIG. 6, the sample and hold circuit 600 includes four switches 611-614 to control whether the MOS switches S1 through S3 are connected to the output of the amplifier A1 or to standard voltages (VPOS and VNEG). The four switches 611-614 may each be embodied as the MOS switch 500, shown in FIG. 5.

In a sample mode, the four switches 611-614 are configured to select the standard voltages (VPOS and VNEG) and thereby tie the tubs to the standard voltages to ensure that the parasitic diodes D0-D3 are reverse biased for the input/output signal range. In a hold mode, the four switches 611-614 are configured to select the out of the amplifier A1 which drives the switch transistor tubs and nodes N1 and N2. In the hold mode, the voltage across S1 and S2 and their parasitic diodes are thus all reduced to the offset voltage of amplifier A1. In the sample mode, switches S1-S3 are closed, switch S4 and S5 are open, and switches 611-614 connect the tubs to VPOS and VNEG.

Switch S0 can be included in an alternate implementation of the sample and hold circuit 600 of FIG. 6 when the sample and hold circuit 600 is driven from a lower impedance source than the GM cell 110, in the manner described above for FIGS. 3 and 4. In such an alternate implementation of the sample and hold circuit 600, the tubs of switch S0 are connected directly to VNEG and VPOS, in a similar manner to switch S3.

Figure 7:
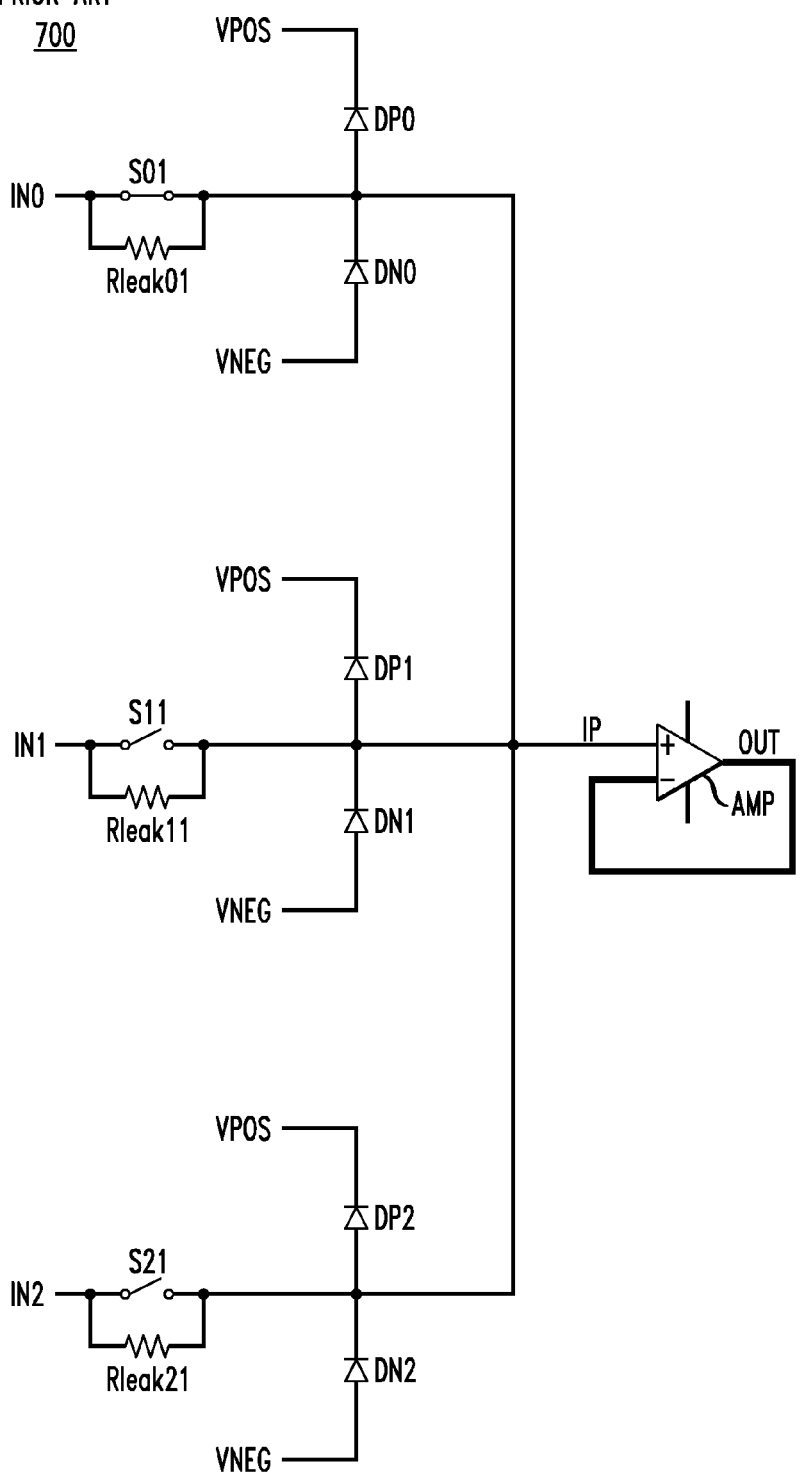
FIG. 7 is a block diagram of a conventional multiple input analog multiplexer.

FIG. 7 is a block diagram of a conventional multiple input analog multiplexer 700 that selectively connects one of the inputs (N0, IN1 and IN2) to an output (OUT). FIG. 7 shows input IN0 connected to node IP via switch S01 One input (IN0, IN1 or IN2) is selected at a given time based on a control signal (not shown). A disadvantage of the multiple input analog multiplexer 700 is the finite impedance of the switches when in the open state. The finite impedance may be modeled by a resistor $R_{leak}$ in parallel with the switch. The leakage path increases in importance as the line width of the CMOS technology decreases. As the transistor gate length is reduced to increase circuit density and increase bandwidth, the off-switch leakage resistance is reduced, resulting in the unselected input signals adding to the selected signal. It is noted that, in FIG. 7, diodes DP0, DP1, and DP2 model the PMOS transistor drain-to-tub diodes and diodes DN0, DN1, and DN2 model the NMOS transistor diodes in switches S01, S11, and S21, respectively.

Figure 8:
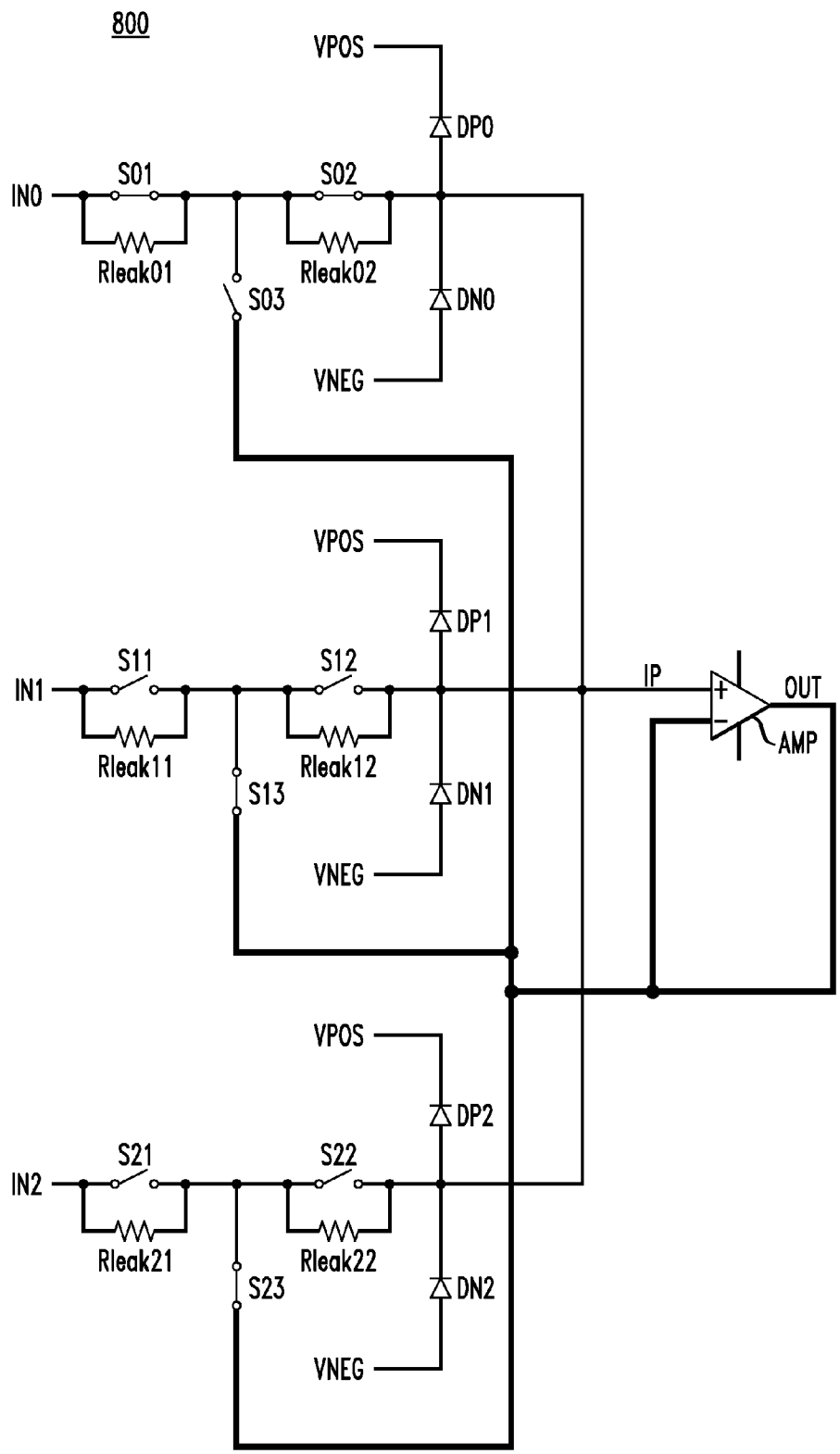
FIG. 8 is a block diagram of a multiple input analog multiplexer that uses a low leakage sample and hold technique in accordance with the present invention.

FIG. 8 is a block diagram of a multiple input analog multiplexer 800 that uses a low leakage sample and hold technique in accordance with the present invention. (For a detailed description of the low leakage sample and hold technique, see Ueno, U.S. Pat. No. 6,407,592 B2, incorporated by reference herein.) One or more inputs (IN0, N1 or 1N2) may be selected at a given time based on a control signal (not shown). FIG. 8 shows the switches in the proper positions to connect the IN0 input to the IP node and to isolate the IP node from inputs IN1 and IN2. In this case, primary switch S01 and secondary switch S02 are closed and output switch S03 is open. The unselected input branches have the primary switches (S11 and S21) and secondary switches (S12 and S22) open and output switches (S13 and S23) closed to minimize the current through the leakage resistances Rleak12 and Rleak22. Diodes DP0, DP1, and DP2 model the PMOS transistor drain-to-tub diodes and diodes DN0, DN1, and DN2 model the NMOS transistor diodes in secondary switches S02, S12, and S22, respectively. The tub diodes are hard wired to the positive (VPOS) and negative (VNEG) power supplies to keep the CMOS parasitic junctions reverse biased under all operating conditions. While the prior art low leakage switch used in sample and hold circuits addresses the switch parallel leakage modeled by Rleak, it does not address the errors caused by the leakage of parasitic diodes DP0, DP1, DP2, DN0, DN1, and DN2. As the architecture shown in FIG. 8 is extended to N inputs, the switch parasitic diodes contribute N−1 times the leakage of diodes DPx and DNx of the selected input circuit.

Figure 9:
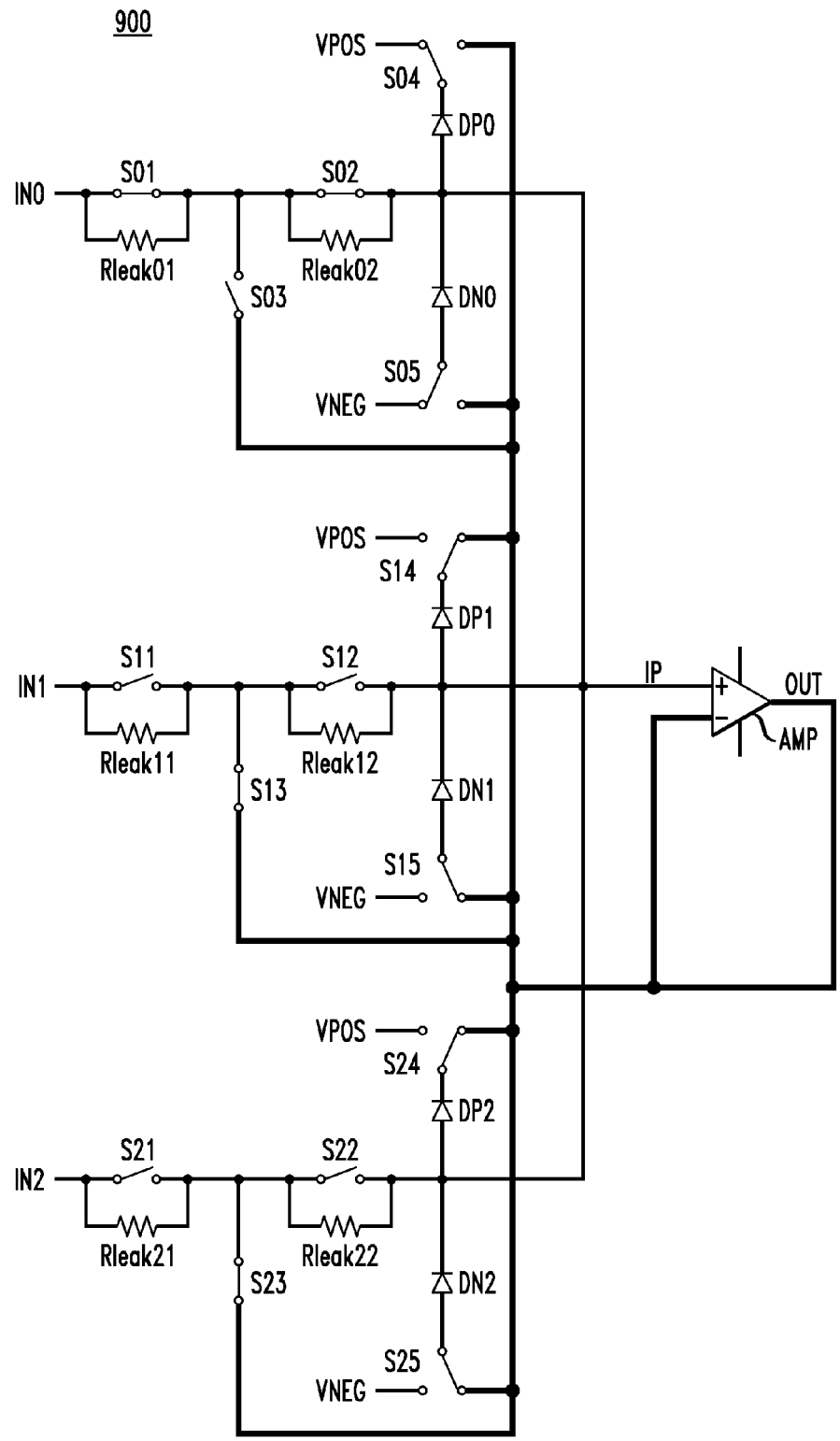
FIG. 9 is a block diagram of an exemplary analog multiplexer circuit 700 having low switch leakage in accordance with the present invention.

FIG. 9 is a block diagram of an exemplary analog multiplexer circuit 900 having low leakage in accordance with the present invention. Analog multiplexer circuit 900 selects one or more of the input signals (IN0, IN1 or IN2) to drive the output (OUT). The switching technique bootstraps the CMOS switch when it is in the off (open) state to reduce the voltage across the open switch and limits the voltage across its drain and source diode junctions to the offset voltage of an operational amplifier AMP (typically less than 10 mV) to minimize the leakage current. The technique can be used to build high precision analog multiplexers.

When input IN0 is selected and coupled to node IP, DP0 is coupled by switch S04 to VPOS and DN0 is coupled by switch S05 to VNEG to ensure that switch S02 can pass signals to output (OUT) without forward biasing its MOS device parasitic diodes modeled by DP0 and DN0. Since inputs IN1 and IN2 are to be isolated from node IP, output switches S13 and S23 are closed and primary switches S11 and S21 and secondary switches S12 and S22 are open. In this configuration, switches S14, S15, S24 and S25 connect the MOS transistor tubs for secondary switches S12 and S22 to the amplifier output node OUT. The voltage across the parasitic diodes is reduced to the DC offset voltage of the amplifier, which is typically less than 10 mV. The diode leakage current is reduced to a very small level. The leakage paths through the open secondary switches S12 and S22, and their associated parasitic junction diodes, are reduced to be much less than the leakage through the parasitic diodes of the selected input circuit. The disclosed technique allows the analog multiplexer circuit 900 to have less error than the architectures of FIGS. 7 and 8 for a given number of inputs and allows many more inputs for a given error allowance.

While the invention has been described with respect to MOSFET transistors, the invention will work with other types of field-effect transistors, including but not limited to JFETs, gallium arsenide transistors, and indium phosphide transistors.

It is to be understood that the embodiments and variations shown and described herein are merely illustrative of the principles of this invention and that various modifications may be implemented by those skilled in the art without departing from the scope and spirit of the invention.

I claim:

1. A circuit, comprising:
   a shared node;
   a plurality of input circuits, each input circuit comprising:
      an input node;
      a primary input switch for selectively coupling an input to said input node; and
      a secondary input switch for selectively coupling said input node to said shared node, wherein said secondary input switch comprises one or more transistor switches;
   a control input for selecting one of said plurality of input circuits; and
   an amplifier coupled to said shared node,
   wherein parasitic drain and source diodes of each transistor switch of said secondary input switch of a selected input circuit are coupled to a voltage that is distinct from an input signal of said selected input circuit, and
   wherein said parasitic drain and source diodes of each transistor switch of a secondary input switch of each input circuit that is not selected are coupled to an output of said amplifier.

2. The circuit as recited in claim 1, wherein said circuit includes a multiplexer function.

3. The circuit as recited in claim 1, wherein each input circuit further comprises an output switch, wherein each output switch of each corresponding input circuit couples a corresponding input node to said output of said amplifier when said corresponding input circuit is not selected and wherein a voltage drop across each secondary input switch of each input circuit that is not selected is substantially limited to an offset voltage of said amplifier.

4. The circuit as recited in claim 1, wherein at least one of said one or more transistor switches of at least one input circuit comprises an NMOS switch and wherein said distinct voltage is a voltage that is more negative than said input signal of said selected input circuit.

5. The circuit as recited in claim 1, wherein at least one of said one or more transistor switches of at least one input circuit comprises a PMOS switch and wherein said distinct voltage is a voltage that is more positive than said input signal of said selected input circuit.

6. The circuit as recited in claim 1, wherein at least one of said one or more transistor switches of at least one input circuit is selected from the group consisting of junction, gallium arsenide or indium phosphide field-effect transistors.

7. The circuit as recited in claim 1, wherein selecting one of said plurality of input circuits comprises selecting at least one of said plurality of input circuits.

8. The circuit as recited in claim 1, wherein the circuit is fabricated as an integrated circuit.

9. A method for reducing leakage in a circuit, said method comprising the steps of:
   configuring a primary input switch of at least one corresponding input circuit to selectively couple an input of said corresponding input circuit to an input node of said corresponding input circuit based on a control signal;
   configuring each secondary input switch of each corresponding input circuit to selectively couple said input node of said corresponding input circuit to a shared node based on said control signal;
   coupling parasitic drain and source diodes of a transistor switch of a secondary input switch of a selected input circuit to a voltage that is distinct from an input signal of said selected input circuit; and
   substantially limiting leakage current of parasitic drain and source diodes of each transistor switch of a secondary input switch of each input circuit that is not selected by coupling said parasitic drain and source diodes of each transistor switch of each input circuit that is not selected to an output of an amplifier.

10. The method of claim 9, wherein each secondary input switch has a leakage effect represented by a resistor, and wherein a voltage drop across said resistor is limited to said offset voltage when a corresponding input circuit is not selected.

11. The method of claim 9, further comprising the step of selectively coupling each input node of each input circuit that is not selected to said output of said amplifier.

12. The method of claim 9, wherein said transistor switch of at least one input circuit comprises an NMOS switch and wherein said distinct voltage is a voltage that is more negative than said input signal of said selected input circuit.

13. The method of claim 9, wherein said transistor switch of at least one input circuit comprises a PMOS switch and wherein said distinct voltage is a voltage that is more positive than said input signal of said selected input circuit.

* * * * *